United States Patent
Shih et al.

(10) Patent No.: US 10,236,931 B2
(45) Date of Patent: Mar. 19, 2019

(54) DUAL-MODE SIGNAL TRANSCEIVER AND TRANSCEIVING METHOD THEREOF

(71) Applicant: Realtek Semiconductor Corporation, Hsinchu (TW)

(72) Inventors: Yi-Chang Shih, Hsinchu (TW); Yu-Che Yang, Hsinchu (TW); Kun-Hsun Liao, New Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/691,772

(22) Filed: Aug. 31, 2017

(65) Prior Publication Data

US 2018/0109281 A1 Apr. 19, 2018

(30) Foreign Application Priority Data

Oct. 14, 2016 (TW) .............................. 105133314 A

(51) Int. Cl.
| | | |
|---|---|---|
| H04B 17/14 | (2015.01) | |
| H04B 1/40 | (2015.01) | |
| H03L 7/00 | (2006.01) | |
| H03C 3/00 | (2006.01) | |

(Continued)

(52) U.S. Cl.
CPC ................. *H04B 1/40* (2013.01); *H03C 3/00* (2013.01); *H03L 7/00* (2013.01); *H04W 4/80* (2018.02); *H04W 88/06* (2013.01)

(58) Field of Classification Search
CPC .......... H04B 1/40; H04W 4/008; H04W 4/80; H04W 88/06
See application file for complete search history.

(56) References Cited

U.S. PATENT DOCUMENTS

| | | | | |
|---|---|---|---|---|
| 5,896,562 A | * | 4/1999 | Heinonen ............... | H03D 7/165 455/552.1 |
| 6,356,770 B1 | * | 3/2002 | Ishida .................... | H04B 1/005 370/347 |
| 6,912,376 B1 | * | 6/2005 | Smith .................... | H04B 1/406 455/112 |
| 2003/0157909 A1 | * | 8/2003 | Atkinson ................ | B01F 5/246 455/130 |
| 2009/0017756 A1 | * | 1/2009 | Tsfaty ................... | H04L 1/1867 455/41.2 |

OTHER PUBLICATIONS

Franz Pengg et al., "A low power miniaturized 1.95mm2 fully integrated transceiver with fastPLL mode for IEEE 802.15.4/ bluetooth smart and proprietary 2.4GHz applications," IEEE Radio Frequency Integrated Circuits Symposium, 2013.

(Continued)

*Primary Examiner* — Dac V Ha
(74) *Attorney, Agent, or Firm* — CKC & Partners Co., LLC

(57) ABSTRACT

A dual-mode signal transceiver includes a first transmitter circuit, a second transmitter circuit, and a receiver circuit. The first transmitter circuit is configured to operate in a first mode and configured to process a first input signal according to a first oscillating signal, in order to output a first output signal. The second transmitter circuit is configured to operate in a second mode and configured to process a second input signal according to a second oscillating signal, in order to output a second output signal, wherein a frequency of the second oscillating signal is not an integral multiple of a frequency of the first oscillating signal. The receiver circuit is configured to process an external signal associated with one of the first mode and the second mode according to the first oscillating signal, in order to read data associated with the external signal.

20 Claims, 3 Drawing Sheets

(51) Int. Cl.
　　　*H04W 4/80*　　　(2018.01)
　　　*H04W 88/06*　　　(2009.01)

(56) References Cited

OTHER PUBLICATIONS

Alan Chi Wai Wong et al., "A 1V 5mA multimode IEEE 802.15.6/ bluetooth low-energy WBAN transceiver for biotelemetry applications," IEEE Journal of Solid-State Circuits vol. 48, No. 1, Jan. 2013.

Yao-Hong Liu et al., "A 2.7nJ/b multi-standard 2.3/2.4GHz polar transmitter for wireless sensor networks," IEEE International Solid-State Circuits Conference, ISSCC 2012, Session 26, Feb. 22, 2012.

Yao-Hong Liu et al., "A 1.9nJ/b 2.4GHz multistandard (Bluetooth Low Energy/Zigbee/IEEE802.15.6) transceiver for personal/body-area networks," IEEE International Solid-State Circuits Conference, ISSCC 2013, Session 25, Feb. 20, 2013.

Sam Chun-Geik Tan et al., "An Ultra-Low-Cost High-Performance Bluetooth SoC in 0.11-μm CMOS," IEEE Journal of Solid-State Circuits, vol. 47, No. 11, Nov. 2012.

M. Ashida et al., "A 65nm CMOS, 1.5-mm2 Bluetooth transceiver with integrated antenna filter for Co-existence with a WCDMA transmitter," IEEE Asian Solid State Circuits Conference, Nov. 12-14, 2012.

\* cited by examiner

DUAL-MODE SIGNAL TRANSCEIVER AND TRANSCEIVING METHOD THEREOF

RELATED APPLICATIONS

This application claims priority to Taiwan Application Serial Number 105133314, filed Oct. 14, 2016, which is herein incorporated by reference.

BACKGROUND

Technical Field

The present disclosure relates to a signal transceiver. More particularly, the present disclosure relates to a signal transceiver applied to dual-mode signals and a method thereof.

Description of Related Art

Bluetooth has been widely applied to various electronic devices in recent years, such that different electronic devices are able to transfer data to each other in a short distance and with low power consumption.

A single communication device generally has multiple wireless transmission configurations, in order to perform a high-speed or a low-speed data transmission according to requirements of users. For example, a communication device having a dual-mode may employ a Bluetooth Low Energy mode to transfer data in much lower power consumption and a lower speed, or may employ a normal Bluetooth or a high-speed Bluetooth to transfer the data in a much higher speed. In current approaches, only an oscillating signal with a single frequency is used to modulate output signals of the multiple wireless transmission configurations. In these approaches, a voltage-controlled oscillator in the system may be affected by a pulling effect, such that a phase error and/or a frequency offset are caused.

SUMMARY

Some aspects of the present disclosure are to provide a dual-mode signal transceiver. The dual-mode signal transceiver includes a first transmitter circuit, a second transmitter circuit, and a receiver circuit. The first transmitter circuit is configured to operate in a first mode and configured to process a first input signal according to a first oscillating signal, in order to output a first output signal. The second transmitter circuit is configured to operate in a second mode and configured to process a second input signal according to a second oscillating signal, in order to output a second output signal, wherein a frequency of the second oscillating signal is not an integral multiple of a frequency of the first oscillating signal. The receiver circuit is configured to process an external signal associated with one of the first mode and the second mode according to the first oscillating signal, in order to read data associated with the external signal.

Some aspects of the present disclosure are to provide a method for transceiving dual-mode signals that includes following operations: in a first mode, processing a first input signal according to a first oscillating signal, in order to output a first output signal; in a second mode, processing a second input signal according to a second oscillating signal, in order to output a second output signal, in which a frequency of the second oscillating signal is not an integral multiple of a frequency of the first oscillating signal; and processing an external signal associated with one of the first mode and the second mode according to the first oscillating signal, in order to read data associated with the external signal.

Some aspects of the present disclosure are to provide to provide a dual-mode signal transceiver. The dual-mode signal transceiver includes a first transmitter circuit, a second transmitter circuit, and a receiver circuit. The first transmitter circuit is configured to operate in a first mode and configured to process a first input signal according to a first oscillating signal, in order to output a first output signal. The second transmitter circuit is configured to operate in a second mode and configured to process a second input signal according to a second oscillating signal, in order to output a second output signal. The receiver circuit is configured to process an external signal associated with one of the first mode and the second mode according to the first oscillating signal, in order to read data associated with the external signal.

As discussed above, the dual-mode transceiver circuit and the method employ oscillating signals having different frequency to receive the dual-mode signals, in order to reduce the impact of the pulling effect and the power consumption.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
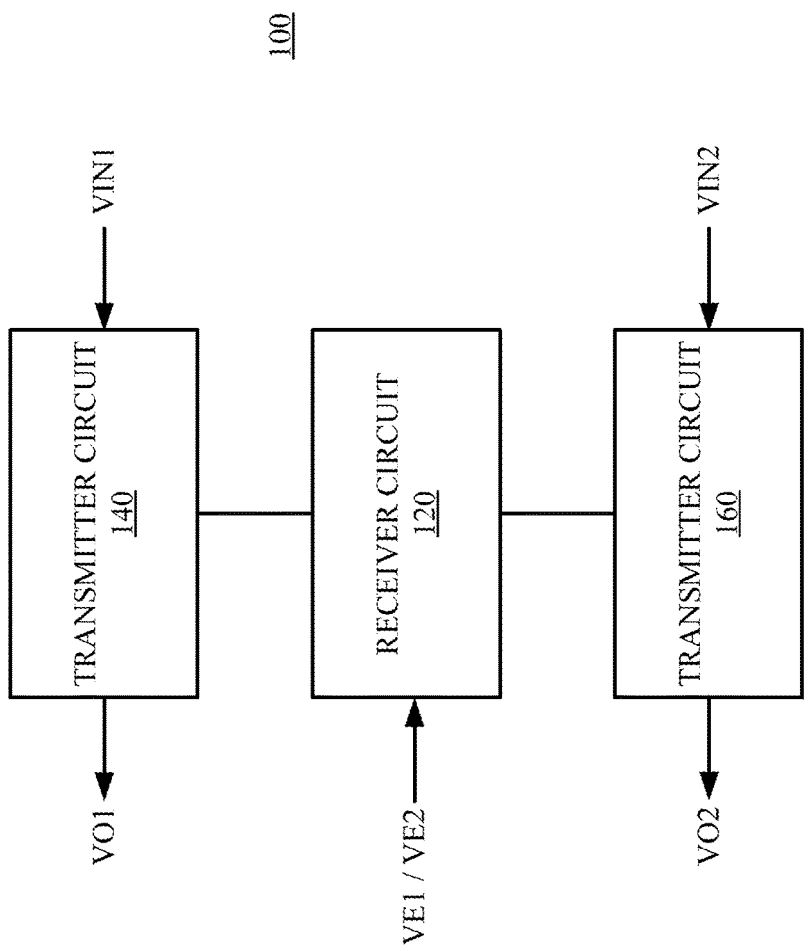
FIG. 1 is a schematic diagram of a dual-mode signal transceiver, according to some embodiments of the present disclosure.

Reference will now be made in detail to the present embodiments of the disclosures, examples of which are illustrated in the accompanying drawings. Wherever possible, the same reference numbers are used in the drawings and the description to refer to the same or like parts.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In this document, the term "coupled" may also be termed as "electrically coupled," and the term "connected" may be termed as "electrically connected". "Coupled" and "connected" may also be used to indicate that two or more elements cooperate or interact with each other.

Reference is made to FIG. 1. FIG. 1 is a schematic diagram of a dual-mode signal transceiver 100, according to some embodiments of the present disclosure. The dual-mode signal transceiver 100 includes a receiver circuit 120, a transmitter circuit 140, and a transmitter circuit 160. In some embodiments, the dual-mode signal transceiver 100 may be configured to transmit output signals VO1-VO2 that are applied in different communication modes.

For example, in some embodiments, the transmitter circuit 140 is operated in a Bluetooth low energy (BLE) mode, in order to transmit the output signal VO1 associated with the BLE mode according to an input signal VIN1. In some embodiments, the transmitter circuit 160 is operated in a normal Bluetooth (BT) mode, in order to transmit the output signal VO2 associated with the BT mode according to an input signal VIN2. In some embodiments, the input signals VIN1-VIN2 may be provided from a baseband circuit (e.g., 210 in FIG. 2 below).

The configurations of the BLE mode and the BT mode are given for illustrative purposes only. Various types of communication modes or transmission modes are within the contemplated scope of the present disclosure.

In some embodiments, the receiver circuit 120 and the transmitter circuit 160 are configured to share an oscillating signal (e.g., VOS1 in FIG. 2 below) generated from a voltage-controlled oscillator (VCO) (e.g., 221 in FIG. 2 below), in order to receive external signals VE1-VE2, respectively according to this oscillating signal, and to generate the output signal VO1.

Figure 2:
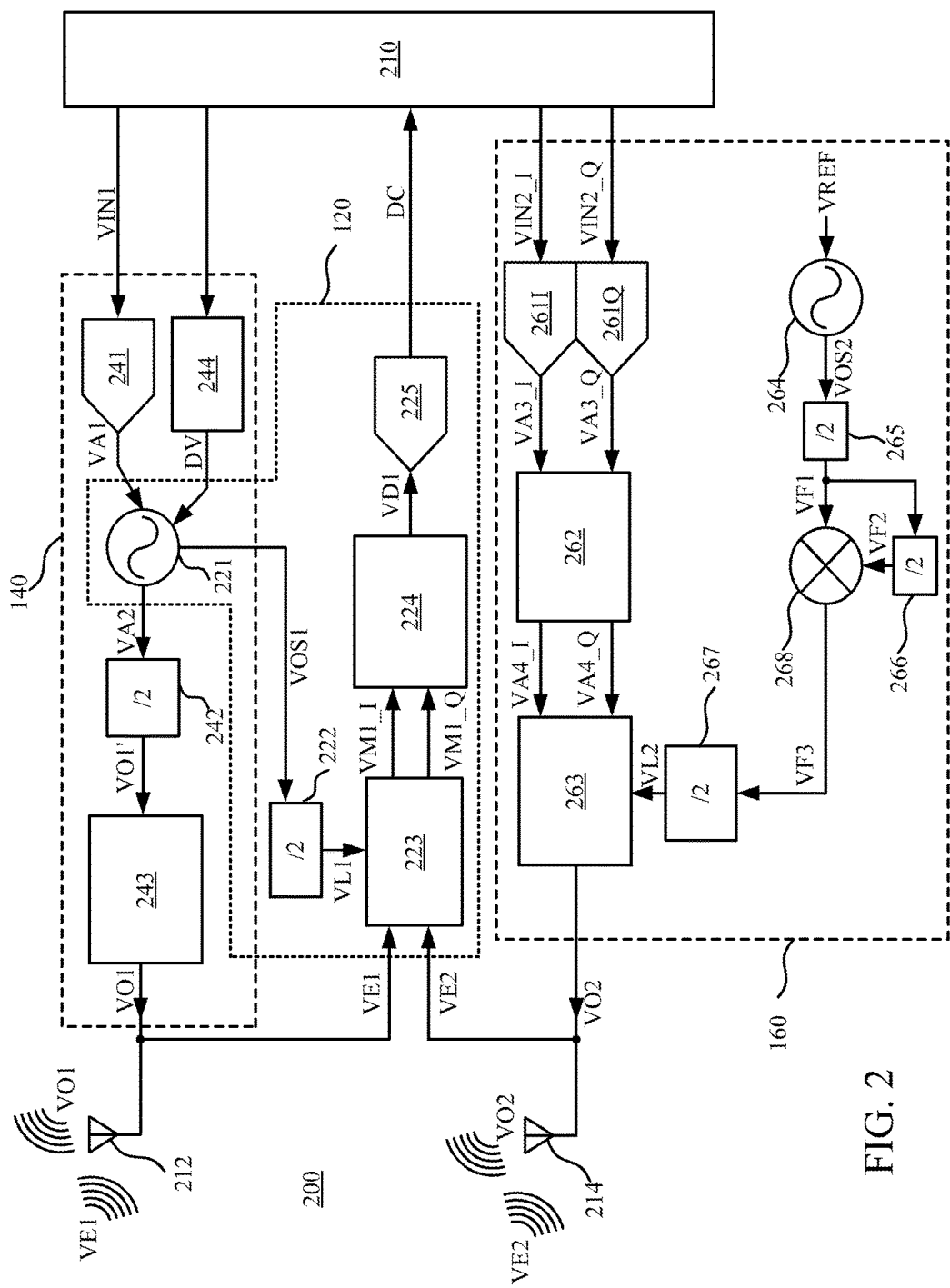
FIG. 2 is a schematic diagram of a dual-mode signal transceiver, according to some embodiments of the present disclosure.

Reference is made to FIG. 2. FIG. 2 is a schematic diagram of a dual-mode signal transceiver 200, according to some embodiments of the present disclosure. For ease of understanding, like elements in FIG. 2 are designated with the same reference number with respect to embodiments of FIG. 1.

The dual-mode signal transceiver 200 includes the receiver circuit 120, the transmitter circuit 140, the transmitter circuit 160, a baseband circuit 210, an antenna 212, and an antenna 214. The receiver circuit 120 is coupled to the antenna 212 and the antenna 214, in order to receive the external signal VE1 associated with a first mode (e.g., BLE mode) from the antenna 212, or to receive the external signal VE2 associated with a second mode (e.g., BT mode) from the antenna 214. The transmitter circuit 140 is coupled to the antenna 212, in order to transmit the output signal VO1. The transmitter circuit 160 is coupled to the antenna 214, in order to transmit the output signal VO2. In some embodiments, the external signal VE1 and the external VE2 may have the same carrier frequency. For example, when the dual-mode signal transceiver 200 is applied to Bluetooth applications, the carrier frequency may be 2.4 GHz.

The receiver circuit 120 and the transmitter circuit 140 together include a VCO 221. The VCO 221 is configured to generate an oscillating signal VOS1 based on an analog signal VA1. In some embodiments, the receiver circuit 120 further includes a frequency divider 222, a front-end circuit 223, a filter circuit 224, and an analog-to-digital converter (ADC) 225. The frequency divider 222 is coupled to the VCO 221, and divides the frequency of the oscillating signal VOS1 (for example, divided by two), in order to generate a local signal VL1.

In some embodiments, the frequency of the external signals VE1-VE2 has a predetermined frequency range, and a frequency of the oscillating signal VOS1 may be predetermined times of the predetermined frequency range. For example, when the dual-mode signal transceiver 200 is applied to Bluetooth applications, the predetermined frequency range is about 2.402-2.480 GHz. Under this condition, the frequency of the oscillating signal VOS1 may be a double of the predetermined frequency range. In other words, the frequency of the oscillating signal VOS1 may be set as about 4.804-4.960 GHz.

The front-end circuit 223 is coupled to the frequency divider 222, in order to receive the local signal VL1. In some embodiments, the front-end circuit 223 is configured to modulate the external signal VE1 or the external signal VE2 based on the oscillating signal VOS1, in order to generate a modulated signal VM1_I and a modulated signal VM1_Q. For example, in some embodiments, the front-end circuit 223 includes at least one low noise amplifier (LNA) (not shown) and a mixer circuit (not shown). The at least one LNA is configured to amplify the external signal VE1 or the external signal VE2. The mixer circuit is configured to modulate the amplified external signal VE1 or the amplified external signal VE2, in order to generate the modulated signal VM1_I and the modulated signal VM1_Q.

The filter circuit 224 is coupled to the front-end circuit 223 and is configured to filter noises on the modulated signals VM1_I and VM1_Q, in order to generate a data signal VD1. The ADC 225 is coupled to the filter circuit 224, and is configured to covert the data signal VD1 to a corresponding digital code DC. The baseband circuit 210 is coupled to the ADC 225, and is configured to read data associated with the external signal VE1 or VE2 based on the digital code DC. In some embodiments, the filter circuit 224 is a complex filter. In some embodiments, the baseband circuit 210 may be implemented with digital circuits. In some embodiments, the digital circuits include a data encoder, a date decoder, and so on.

The configurations of the front-end circuit 223, the filter circuit 224, and the baseband circuit 210 are given for illustrative purposes only. Various types of the front-end circuit 223, the filter circuit 224, and the baseband circuit 210 are within the contemplated scope of the present disclosure.

In some embodiments, the receiver circuit 120 further includes a digital-to-analog converter (DAC) 241, a frequency divider 242, a front-end circuit 243, and a divider 244. The DAC 241 is coupled to the baseband circuit 210 to receive the input signal VIN1. The DAC 241 is configured to convert the input signal VIN1 to a corresponding analog signal VA1.

In some embodiments, the VCO 221 is further operated as a frequency synthesizer. In this example, the VCO 221 may perform a frequency modulation according to the analog signal VA1 and a divisor signal DV, in order to generate the analog signal VA2. The divider 244 is coupled to the baseband circuit 210, and generates the divisor signal DV based on the control of the baseband circuit 210. In some embodiments, the frequency modulation includes Gaussian frequency-Shift Keying.

The configuration of the frequency modulation is given for illustrative purposes only. Various frequency modulations that are able to be applied to the VCO 221 are within contemplated scope of the present disclosure. For example, in some other embodiments, the VCO 221 may perform the frequency modulation without the divider 244 to generate the analog signal VA2. In some embodiments, the frequency modulation includes two-point modulation.

The frequency divider 242 is coupled to the VCO 221, and is configured to divide the frequency of the analog signal VA2 (for example, divided by two), in order to generate an output signal VO1'. The front-end circuit 243 is coupled between the frequency divider 242 and the antenna 212, and is configured to amplify the output signal VO1' to generate the output signal VO1. Accordingly, the output signal VO1 may be transmitted outwardly by the antenna 212.

In some embodiments, the front-end circuit 243 includes a power amplifier (not shown) that is configured to amplify the output signal VO'. In some other embodiments, the front-end circuit 243 further includes a power amplifier driver (not shown) that is configured to drive the power amplifier. The arrangements of the front-end circuit 243 are given for illustrative purposes only. Various types of the front-end circuit 243 are within the contemplated scope of the present disclosure.

In some embodiments, the transmitter circuit 160 includes DACs 261I and 261Q, a filter 262, a front-end circuit 263, a VCO 264, frequency dividers 265-267, and a mixer 268.

The DACs 261I and 261Q are coupled to the baseband circuit 210, in order to receive a corresponding input signal VIN2_I and an input signal VIN2_Q, respectively. In some embodiments, the input signal VIN2_I and the input signal VIN2_Q are different in phase by about 90 degrees. In some embodiments, the input signal VIN2_I and the input signal VIN2_Q may be linearly superposed as the single input signal VIN2 in FIG. 1. The DAC 261I is configured to convert the input signal VIN2_I to a corresponding analog signal VA3_I. The DAC 261Q is configured to convert the input signal VIN2_Q to a corresponding analog signal VA3_Q.

The filter 262 is coupled to the DACs 261I and 261Q. The filter 262 is configured to filter the noises on the analog signals VA3_I and VA3_Q, in order to generate analog signals VA4_I and VA4_Q, respectively. In some embodiments, the filter 262 is a low pass filter. The configuration of the filter 262 is given for illustrative purposes only. Various types of the filter 262 are within the contemplated scope of the present disclosure.

The front-end circuit 263 is coupled to the filter 262 and the antenna 214. In some embodiments, the front-end circuit 263 is configured to respectively modulate the analog signals VA4_I and VA4_Q based on a local signal VL2, and to amplify the modulated signals to generate the output signal VO2. Accordingly, the output signal VO2 may be transmitted outwardly by the antenna 214.

In some embodiments, the front-end circuit 263 includes a mixer (not shown) and a power amplifier (not shown). The mixer is configured to respectively modulate the analog signals VA4_I and VA4_Q based on the local signal VL2. The power amplifier is configured to amplify an output signal of the mixer. In some other embodiments, the front-end circuit 263 further includes a power amplifier driver (not shown) that is configured to drive the power amplifier. The arrangements of the front-end circuit 263 are given for illustrative purposes only. Various types of the front-end circuit 263 are within the contemplated scope of the present disclosure.

The VCO 264 is configured to generate the oscillating signal VOS2 according to a voltage signal VREF. The frequency divider 265 is coupled to the VCO 264, and is configured to divide the frequency of the oscillating signal VOS2 (for example, divided by two), in order to generate a frequency signal VF1. The frequency divider 266 is coupled to the frequency divider 265, and is configured to divide the frequency of the frequency signal VF1 (for example, divided by two), in order to generate a frequency signal VF2. The mixer 268 is coupled to the frequency dividers 265-266, in order to generate a frequency signal VF3 based on the frequency signal VF1 and the frequency signal VF2. The frequency divider 267 is coupled to the mixer 268 and is configured to divide a frequency of the frequency signal VF3 (for example, divided by two), in order to generate the local signal VL2.

In some embodiments, the voltage signal VREF is a predetermined reference voltage signal.

In some related approaches, the transmitter circuit, which is operated in the BT mode, employs the VCO to directly generate the oscillating signal having a frequency that is a multiple of 2.4 GHz, in order to modulate the analog signal to make the output signal of the transmitter circuit have a radio frequency of 2.4 GHz. In these related approaches, a pulling effect is introduced to the transmitter circuit, which operates in the BT mode, due to switching of the operating mode. For example, when the transmitter circuit, which operates in the BT mode, is switched from a standby mode to a normal mode, the power of a signal transmitted from the transmitter circuit is instantly increased, such that the power of the signal at its harmonic tones (i.e., the multiple of 2.4 GHz) are also increased to cause the pulling effect on the VCO, which outputs the oscillating signal having a frequency that is the multiple of 2.4 GHz.

Compared with these approaches, in some embodiments, a frequency of the oscillating signal VOS2 is higher than a frequency of the oscillating signal VOS1. In some embodiments, the frequency of the oscillating signal VOS2 is not an integral multiple of the frequency of the oscillating signal VOS1. For example, when the transmitter circuit 140 operates in the BLE mode and the transmitter circuit 160 operates in the BT mode, the frequency of the oscillating signal VOS2 is about 6.4 GHz, and the frequency of the oscillating signal VOS1 is about 4.8 GHz. In other words, for the BT mode, the transmitter circuit 160 is operated based on the oscillating signal VOS2 having a frequency of about 6.4 GHz, and the receiver circuit 120 is operated based on the oscillating signal VOS1 having a frequency of about 4.8 GHz. As the VCO 264 does not output the oscillating signal having a frequency that is the multiple of 2.4 GHz, the output signal VO2 does not introduce the pulling effect to the VCO 264.

Furthermore, in some related approaches, the receiver circuit employs the VCO to directly generate an oscillating signal having a frequency of 2.4 GHz for operations. In these approaches, it is required an additional multi-phase filer to process an in-phase signal and a quadrature signal, which are different in phase by 90 degrees. As a result, the overall power consumption is increased, and noises (e.g., image signals) become more. Compared with these approaches, with the arrangement of the oscillating signal VOS1 having the frequency of about 4.8 GHz, the receiver circuit 120 can be more balanced in tradeoff between the power consumption and the circuit performance.

The values of the frequency of the oscillating signals VOS1-VOS2 are given for illustrative purposes only. Various values of other frequency, which meet the design consideration as discussed above, are within the contemplated scope of the present disclosure.

In various embodiments, the dual-mode signal transceiver 200 further includes impedance matching circuits (not shown) and transformers (not shown). Each of the impedance matching circuits is arranged between each of the antenna 212 and 214 and a signal processing circuit (i.e., the receiver circuit 120 and the transmitter circuit 140 and 160), in order to improve the impedance matching for subsequent circuits and the antennas. Furthermore, each of the transformers is arranged between each of the impedance matching circuits and the signal processing circuit, in order to transmit the output signals VO1-VO2 having a high frequency and the external signals VE1-VE2. In some embodiment, the transformers may be implemented with balance/unbalance Baluns.

Figure 3:
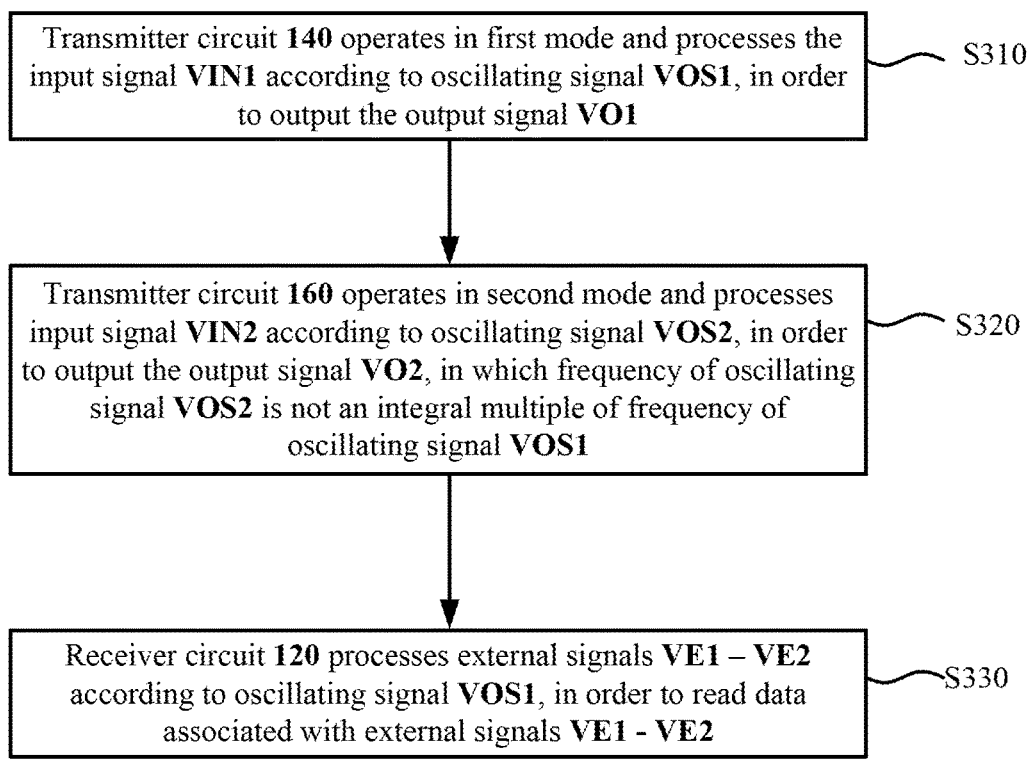
FIG. 3 is a flow chart of a method for transceiving dual-mode signals, according to some embodiments of the present disclosure.

Reference is now made to FIG. 3. FIG. 3 is a flow chart of a method 300 for transceiving dual-mode signals, according to some embodiments of the present disclosure. For ease of understanding, related operations of the dual-mode signal transceiver 100 and 200 are described with reference to FIGS. 1-3. In some embodiments, the method 300 includes operations S310-S330.

In operation S310, the transmitter circuit 140 operates in the first mode and processes the input signal VIN1 according to the oscillating signal VOS1, in order to output the output signal VO1. For illustration, as show in FIG. 2, the transmitter circuit 140 operates in the BLE mode, and transmits the output signal VO2 via the antenna 212 according to the input signal VIN1.

In operation S320, the transmitter circuit 160 operates in the second mode and processes the input signal VIN2 according to the oscillating signal VOS2, in order to output the output signal VO2, in which the frequency of the oscillating signal VOS2 is not an integral multiple of the frequency of the oscillating signal VOS1. For illustration, as shown in FIG. 2, the transmitter circuit 160 is operated in the BT mode, and transmits the output signal VO2 via the antenna 214 according to the input signal VIN2. Furthermore, as discussed above, in some embodiments, the frequency of the oscillating signal VOS2 may be set to be about 6.4 GHz, and the frequency of the oscillating signal VOS1 may be set to be about 4.8 GHz, in order to prevent from generating the pulling effect.

In operation S330, the receiver circuit 120 processes the external signals VE1-VE2 according to the oscillating signal VOS1, in order to read data associated with the external signals VE1-VE2. For illustration, as shown in FIG. 2, the receiver circuit 120 receives the external signal VE1 associated with the BLE mode from the antenna 212, or receives the external signal VE2 associated with the BT mode from the antenna 214. In some embodiments, the receiver circuit 120 is able to amplify, filter, and covert the external signal VE1 or VE2, in order to generate the digital code DC. As a result, the baseband circuit 210 may analysis the digital code DC to read the data contained in the external signal VE1 or VE2.

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of various embodiments of the present disclosure.

As discussed above, the dual-mode transceiver circuit and the method employ oscillating signals having different frequency to receive the dual-mode signals, in order to reduce the impact of the pulling effect and the power consumption.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A dual-mode signal transceiver comprising:
    a first transmitter circuit configured to operate in a first mode and configured to process a first input signal according to a first oscillating signal, in order to output a first output signal;
    a second transmitter circuit configured to operate in a second mode and configured to process a second input signal according to a second oscillating signal, in order to output a second output signal, wherein a frequency of the second oscillating signal is not an integral multiple of a frequency of the first oscillating signal; and
    a single receiver circuit configured to process a first external signal and a second external signal according to the first oscillating signal, in order to read data associated with the first external signal and the second external signal, wherein the first external signal corresponds to the first mode and the second external signal corresponds to the second mode, and the frequency of the first oscillating signal corresponds to the first mode.

2. The dual-mode signal transceiver of claim 1, wherein the first external signal and the second external signal have a predetermined frequency range, and the frequency of the first oscillating signal is a predetermined number of times of the predetermined frequency range.

3. The dual-mode signal transceiver of claim 1, wherein two of the first transmitter circuit and the single receiver circuit comprises a voltage-controlled oscillator, and the voltage-controlled oscillator is configured to generate the first oscillating signal according to a first analog signal.

4. The dual-mode signal transceiver of claim 3, wherein the first transmitter circuit comprises:
    a digital-to-analog converter configured to covert the first input signal, in order to generate the first analog signal.

5. The dual-mode signal transceiver of claim 3, wherein the voltage-controlled oscillator is further configured to perform a frequency modulation according to the first analog signal to generate a second analog signal, and the first transmitter circuit is further configured to output the first output signal based on the second analog signal.

6. The dual-mode signal transceiver of claim 1, wherein the single receiver circuit is configured to modulate the first external signal and the second external signal according to the first oscillating signal, in order to read the data.

7. The dual-mode signal transceiver of claim 1, wherein the second transmitter circuit comprises:
    a voltage-controlled oscillator configured to generate the second oscillating signal according to a voltage signal.

8. The dual-mode signal transceiver of claim 1, wherein the second transmitter circuit further comprises:
    a digital-to-analog converter configured to generate an analog signal based on the second input signal,
    wherein the second transmitter circuit is further configured to modulate the analog signal according to the second oscillating signal, in order to output the second output signal.

9. The dual-mode signal transceiver of claim 1, wherein the first mode is a Bluetooth low energy mode, and the second mode is a normal Bluetooth mode.

10. The dual-mode signal transceiver of claim 1, wherein the frequency of the first oscillating signal is 4.8 gigahertz (GHz), and the frequency of the second oscillating signal is 6.4 GHz.

11. A method for transceiving dual-mode signals, comprising:
    in a first mode, processing a first input signal according to a first oscillating signal, in order to output a first output signal;
    in a second mode, processing a second input signal according to a second oscillating signal, in order to output a second output signal, wherein a frequency of the second oscillating signal is not an integral multiple of a frequency of the first oscillating signal; and
    processing, by a single receiver circuit, a first external signal and a second external signal according to the first oscillating signal, in order to read data associated with the first external signal and the second external signal, wherein the first external signal corresponds to the first mode and the second external signal corresponds to the second mode, and the frequency of the first oscillating signal corresponds to the first mode.

12. The method of claim 11, wherein the first external signal and the second external signal have a predetermined frequency range, and the frequency of the first oscillating signal is a predetermined number of times of the predetermined frequency range.

13. The method of claim 11, wherein the first mode is a Bluetooth low energy mode, and the second mode is a normal Bluetooth mode.

14. The method of claim 11, wherein the frequency of the first oscillating signal is 4.8 gigahertz (GHz), and the frequency of the second oscillating signal is 6.4 GHz.

15. The method of claim 11, further comprising:
generating, by a voltage-controlled oscillator, the first oscillating signal according to a first analog signal.

16. The method of claim 15, wherein processing the first input signal comprises:
generating the first analog signal based on the first input signal;
performing a frequency modulation according to the first analog signal, in order to generate a second analog signal; and
outputting the first output signal based on the second analog signal.

17. The method of claim 16, wherein generating the first analog signal comprises:
converting, by a digital-to-analog converter, the first input signal to generate the first analog signal.

18. The method of claim 11, wherein processing the first external signal and the second external signal comprises:
modulating the first external signal and the second external signal according to the first oscillating signal to read the data.

19. The method of claim 11, wherein processing the second input signal comprises:
generating an analog signal based on the second input signal; and
modulating the analog signal according to the second oscillating signal, in order to output the second output signal.

20. A dual-mode signal transceiver comprising:
a first transmitter circuit configured to operate in a first mode and configured to process a first input signal according to a first oscillating signal, in order to output a first output signal;
a second transmitter circuit configured to operate in a second mode and configured to process a second input signal according to a second oscillating signal, in order to output a second output signal; and
a single receiver circuit configured to process a first external signal and a second external signal according to the first oscillating signal, in order to read data associated with the first external signal and the second external signal, wherein the first external signal corresponds to the first mode and the second external signal corresponds to the second mode, and a frequency of the first oscillating signal corresponds to the first mode.

* * * * *